United States Patent
Slovin et al.

(10) Patent No.: US 10,475,993 B1
(45) Date of Patent: Nov. 12, 2019

(54) PCM RF SWITCH FABRICATION WITH SUBTRACTIVELY FORMED HEATER

(71) Applicant: Newport Fab, LLC, Newport Beach, CA (US)

(72) Inventors: Gregory P. Slovin, Irvine, CA (US); Jefferson E. Rose, Hawthorne, CA (US); David J. Howard, Irvine, CA (US); Michael J. DeBar, Tustin, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/103,646

(22) Filed: Aug. 14, 2018

(51) Int. Cl.
  *H01L 45/00* (2006.01)
  *H01L 23/66* (2006.01)

(52) U.S. Cl.
  CPC ........... *H01L 45/065* (2013.01); *H01L 23/66* (2013.01); *H01L 45/126* (2013.01); *H01L 45/1226* (2013.01); *H01L 45/1286* (2013.01); *H01L 45/143* (2013.01); *H01L 45/144* (2013.01); *H01L 45/1616* (2013.01); *H01L 45/1625* (2013.01); *H01L 45/1675* (2013.01)

(58) Field of Classification Search
  CPC . H01L 45/065; H01L 45/144; H01L 45/1675; H01L 45/1625; H01L 45/1616; H01L 23/66; H01L 45/1286; H01L 45/126; H01L 45/1226; H01L 45/143
  See application file for complete search history.

(56) References Cited

U.S. PATENT DOCUMENTS

| | | | |
|---|---|---|---|
| 5,976,932 A * | 11/1999 | Kerber | H01L 29/42324 438/257 |
| 6,448,576 B1 * | 9/2002 | Davis | H01L 23/5256 257/50 |
| 9,257,647 B2 | 2/2016 | Borodulin | |

(Continued)

FOREIGN PATENT DOCUMENTS

WO  WO 2016/028362  2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.

(Continued)

*Primary Examiner* — Syed I Gheyas
(74) *Attorney, Agent, or Firm* — Farjami & Farjami LLP

(57) ABSTRACT

In fabricating a radio frequency (RF) switch, a heat spreader is provided and a heating element is deposited. A thermally conductive and electrically insulating material is deposited over the heating element. The heating element and the thermally conductive and electrically insulating material are patterned, where the thermally conductive and electrically insulating material is self-aligned with the heating element. A layer of an upper dielectric is deposited. A conformability support layer is optionally deposited over the upper dielectric and the thermally conductive and electrically insulating material. A phase-change material is deposited over the optional conformability support layer and the underlying upper dielectric and the thermally conductive and electrically insulating material.

20 Claims, 10 Drawing Sheets

(56) References Cited

U.S. PATENT DOCUMENTS

| | | | |
|---|---|---|---|
| 9,362,492 | B2 | 6/2016 | Goktepeli |
| 9,368,720 | B1 | 6/2016 | Moon |
| 9,640,759 | B1 | 5/2017 | Curioni |
| 9,917,104 | B1 | 3/2018 | Roizin |
| 2006/0246712 | A1 | 11/2006 | Kim |
| 2007/0075347 | A1 | 4/2007 | Lai |
| 2013/0187120 | A1 | 7/2013 | Redaelli |
| 2013/0285000 | A1 | 10/2013 | Arai |
| 2014/0264230 | A1* | 9/2014 | Borodulin ............ H01L 45/126 257/4 |
| 2015/0090949 | A1 | 4/2015 | Chang |
| 2016/0035973 | A1 | 2/2016 | Raieszadeh |
| 2016/0071653 | A1* | 3/2016 | Lamorey ............... H05B 3/023 361/282 |
| 2017/0092694 | A1 | 3/2017 | BrightSky |
| 2017/0365427 | A1* | 12/2017 | Borodulin ............... H01L 45/06 |
| 2018/0005786 | A1 | 1/2018 | Navarro |
| 2018/0269393 | A1 | 9/2018 | Zhang |
| 2019/0064555 | A1* | 2/2019 | Hosseini ............... G02F 1/0147 |
| 2019/0067572 | A1 | 2/2019 | Tsai |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

PCM RF Switch Manufacturing Process (cont.)

US 10,475,993 B1

PCM RF SWITCH FABRICATION WITH SUBTRACTIVELY FORMED HEATER

RELATED APPLICATION(S)

The present application is related to U.S. patent application Ser. No. 16/103,490, filed on Aug. 14, 2018, and titled "Manufacturing RF Switch Based on Phase-Change Material," and U.S. patent application Ser. No. 16/103,587, filed on Aug. 14, 2018, and titled "Design for High Reliability RF Switch Based on Phase-Change Material." The disclosures of these related applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds. This presents a particular challenge for switching devices to prevent degradation due to high thermal energy while achieving fast switching times.

Additionally, the ongoing need for miniaturization introduces upper limits on driving voltages as well as overall device dimensions, often creating tradeoffs with parasitics associated with RF frequencies and resulting in performance tradeoffs. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art for reliably manufacturing low voltage and low parasitics PCM RF switches on a large scale.

SUMMARY

The present disclosure is directed to a phase-change material (PCM) RF switch fabrication with subtractively formed heater, substantially as shown in and/or described in connection with at least one of the figures, and as set forth in the claims.

DETAILED DESCRIPTION

Figure 1A:
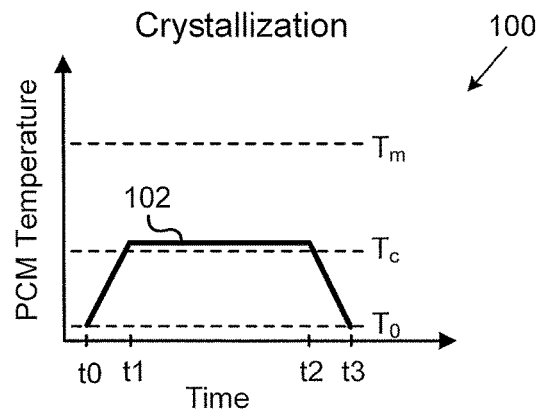
FIG. 1A illustrates an exemplary graph of phase-change material (PCM) temperature versus time according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
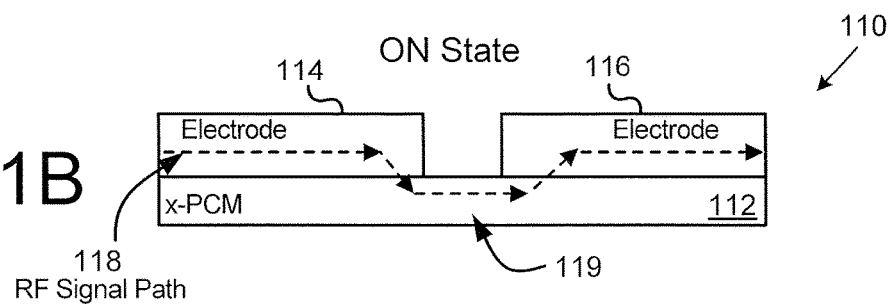
FIG. 1B illustrates a portion of an exemplary PCM radio frequency (RF) switch in an ON state according to one implementation of the present application.

Prior to a description of manufacturing methods according to the present application, some relevant concepts in relation to radio frequency (RF) switches based on phase-change material (PCM) are discussed by reference to FIGS. 1A through 2C. FIG. 1A illustrates an exemplary graph of PCM temperature versus time according to one implementation of the present application. As illustrated in FIG. 1A, PCM temperature-time graph 100 includes trace 102 which represents the temperature of an "active segment" of a PCM, such as active segment 119 of PCM 112 in FIG. 1B, plotted over time when a crystallizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 1A, from time t0 to time t1, trace 102 rises from initial temperature $T_0$ to approximately above crystallization temperature $T_C$. From time t1 to time t2, trace 102 remains approximately above crystallization temperature $T_C$. From time t2 to time t3, trace 102 falls from approximately above crystallization temperature $T_C$ to approximately initial temperature $T_0$.

A heat pulse that holds the PCM at or above crystallization temperature $T_C$ for a sufficient amount of time will transform the PCM into a crystalline state. Accordingly, such a pulse may be referred to as a crystallizing pulse in the present application. Crystallization temperature $T_C$ depends on the PCM material. In one implementation, crystallization temperature $T_C$ can be approximately two hundred degrees Celsius (200° C.). The amount of time needed to transform the PCM into a crystalline state depends on the material, dimensions, temperature, and thermal conductivity of both the PCM and its surrounding structures. In one implementation, the time required can be approximately one microsecond (1 μs) or greater or less. In the present exemplary implementation, the duration from time t1 to time t2 in PCM temperature-time graph 100 can be approximately one microsecond (1 μs), and thus, trace 102 represents a crystallizing pulse (trace 102 is also referred to as crystallizing pulse 102 in the present application).

FIG. 1B illustrates a portion of an exemplary PCM RF switch according to one implementation of the present application. As illustrated in FIG. 1B, PCM RF switch 110 includes PCM 112, input electrode 114, output electrode 116, and RF signal path (or simply referred to as "RF signal") 118. FIG. 1B illustrates PCM RF switch 110 after a crystallizing pulse is applied to PCM 112. PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from 40% to 60% germanium by composition (i.e., $Ge_XTe_Y$, where $0.4 \leq X \leq 0.6$ and $Y=1-X$). As shown in FIG. 1B, PCM 112 is uniform and is denoted with the label "x-PCM," to indicate that PCM 112 is in the crystalline state. PCM 112 in the crystalline state has low resistivity and is able to easily conduct electrical current. Accordingly, RF signal 118 propagates along a path from input electrode 114, through PCM 112, to output electrode 116. It is noted that input electrode 114 and output electrode 116 can be substantially symmetrical and that their roles in PCM RF switch 110 can be reversed. PCM RF switch 110 in FIG. 1B is in an ON state.

Figure 1C:
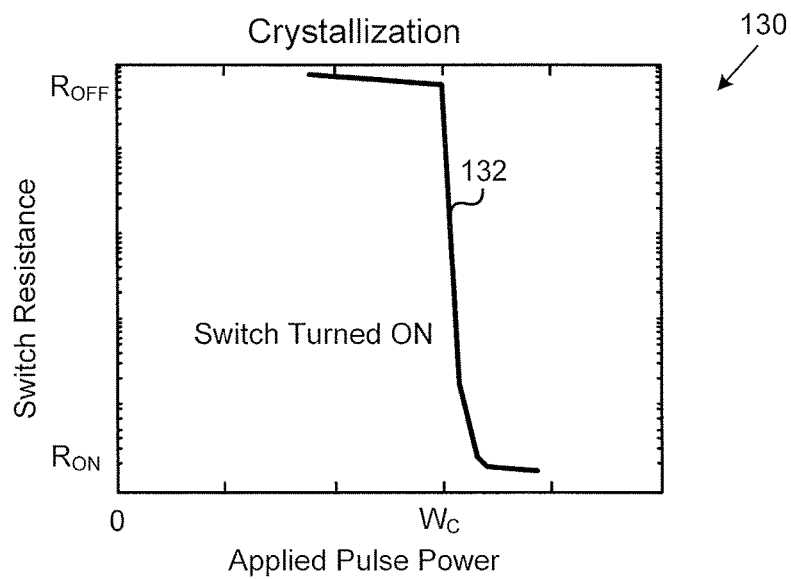
FIG. 1C illustrates an exemplary graph of switch resistance versus applied pulse power according to one implementation of the present application.

FIG. 1C illustrates an exemplary graph of switch resistance versus applied pulse power according to one implementation of the present application. As illustrated in FIG. 1C, switch resistance-applied pulse power graph 130 includes trace 132 that represents the resistance of PCM RF switch 110 in FIG. 1B, seen across input electrode 114 and output electrode 116, in response to a crystallizing pulse applied to PCM 112. As shown in FIG. 1C, when the pulse power increases past crystallization power We (i.e., past the power needed to heat PCM 112 to crystallization temperature $T_C$), switch resistance decreases from $R_{OFF}$ to $R_{ON}$ as shown by trace 132. In one implementation, crystallization power $W_C$ can be approximately three tenths of a Watt (0.3 W). In various implementations, $R_{OFF}$ can range from approximately ten kilo-Ohms to approximately one mega-Ohm (10 kΩ-1MΩ). In one implementation, $R_{ON}$ can be approximately one Ohm (1Ω). Thus, trace 132 corresponds to PCM RF switch 110 turning ON in response to a crystallizing pulse.

Figure 2A:
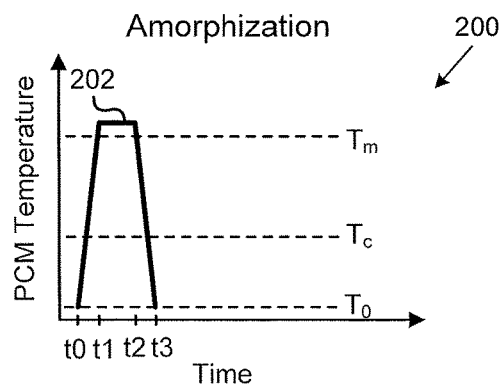
FIG. 2A illustrates an exemplary graph of PCM temperature versus time according to one implementation of the present application.
Figure 2B:
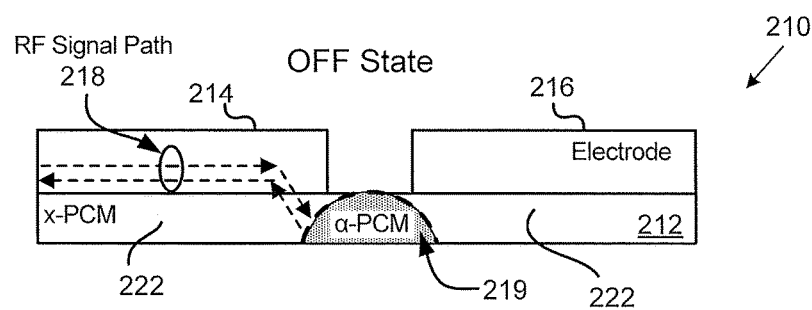
FIG. 2B illustrates a portion of an exemplary PCM RF switch in an OFF state according to one implementation of the present application.

FIG. 2A illustrates an exemplary graph of PCM temperature versus time according to one implementation of the present application. As illustrated in FIG. 2A, PCM temperature-time graph 200 includes trace 202 which represents the temperature of an "active segment" of a PCM, such as active segment 219 of PCM 212 in FIG. 2B, plotted over time when an amorphizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 2A, from time t0 to time t1, trace 202 rises from initial temperature $T_0$ to approximately above melting temperature $T_M$. From time t to time t2, trace 202 remains approximately above melting temperature $T_M$. From time t2 to time t3, trace 202 falls from approximately above melting temperature $T_M$ to approximately initial temperature $T_0$. Notably, from time t0 to time t3, trace 202 in FIG. 2A rises and falls more quickly than trace 102 in FIG. 1A.

A heat pulse that melts and rapidly quenches the PCM from a temperature at or above melting temperature $T_M$ will transform the PCM into an amorphous state. Accordingly, such a pulse may be referred to as an amorphizing pulse in the present application. Melting temperature $T_M$ depends on the PCM material. In one implementation, melting temperature $T_M$ can be approximately seven hundred degrees Celsius (700° C.). How rapidly the PCM must be quenched in order to transform the PCM into an amorphous state depends on the material, dimensions, temperature, and thermal conductivity of both the PCM and its surrounding structures. In one implementation, the quench time window can be approximately one hundred nanoseconds (100 ns) or greater or less. In this implementation, the duration from time t2 to time t3 in PCM temperature graph 200 can be approximately one hundred nanoseconds (100 ns), and thus, trace 202 represents an amorphizing pulse (trace 202 is also referred to as amorphizing pulse 202 in the present application).

FIG. 2B illustrates a portion of an exemplary PCM RF switch according to one implementation of the present application. As illustrated in FIG. 2B, PCM RF switch 210 includes PCM 212, input electrode 214, output electrode 216, and RF signal path (or simply referred to as "RF signal") 218. FIG. 2B illustrates PCM RF switch 210 after an amorphizing pulse is applied to PCM 212. PCM RF switch 210 in FIG. 2B generally corresponds to PCM RF switch 110 in FIG. 1B, and may have any of the implementations and advantages thereof. As shown in FIG. 2B, PCM 212 is not uniform. PCM 212 includes active segment 219, and passive segments 222. As used herein, "active segment" refers to a segment of PCM that transforms between crystalline and amorphous states, for example, in response to heat pulses, whereas "passive segment" refers to a segment of PCM that does not make such transformation and maintains a crystalline state (i.e., maintains a conductive state). Active segment 219 is denoted with the label "α-PCM," to indicate that active segment 219 is in the amorphous state. Passive segments 222 are denoted with the label "x-PCM," to indicate that passive segments 222 are in the crystalline state. PCM 212 in the amorphous state has high resistivity and is not able to conduct electrical current well. Accordingly, RF signal 218 does not propagate along a path from input electrode 214, through PCM 212, to output electrode 216. It is noted that input electrode 214 and output electrode 216 can be substantially symmetrical and that their roles in PCM RF switch 210 can be reversed. PCM RF switch 210 in FIG. 2B is in an OFF state.

Figure 2C:
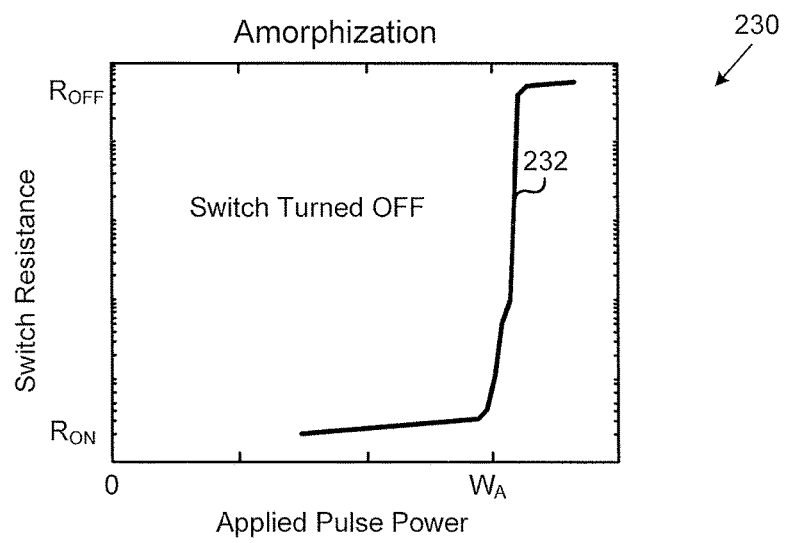
FIG. 2C illustrates an exemplary graph of switch resistance versus applied pulse power according to one implementation of the present application.

FIG. 2C illustrates an exemplary graph of switch resistance versus applied pulse power according to one implementation of the present application. As illustrated in FIG. 2C, switch resistance graph 230 includes trace 232 that represents the resistance of PCM RF switch 210 in FIG. 2B, seen across input electrode 214 and output electrode 216, in response to an amorphizing pulse is applied to PCM 212. As shown in FIG. 2C, when the pulse power increases past amorphization power $W_A$ (i.e., past the power needed to heat PCM 212 to melting temperature $T_M$), switch resistance increases from $R_{ON}$ to $R_{OFF}$ as shown by trace 232. In one implementation, amorphization power $W_A$ can be approximately one and a half Watts (1.5 W). In various implementations, $R_{OFF}$ can range from approximately ten kilo-Ohms to approximately one mega-Ohm (10 kΩ-1MΩ). In one implementation, $R_{ON}$ can be approximately one Ohm (1Ω).

Thus, trace 232 represents PCM RF switch 210 turning OFF in response to an amorphizing pulse.

Figure 3A:
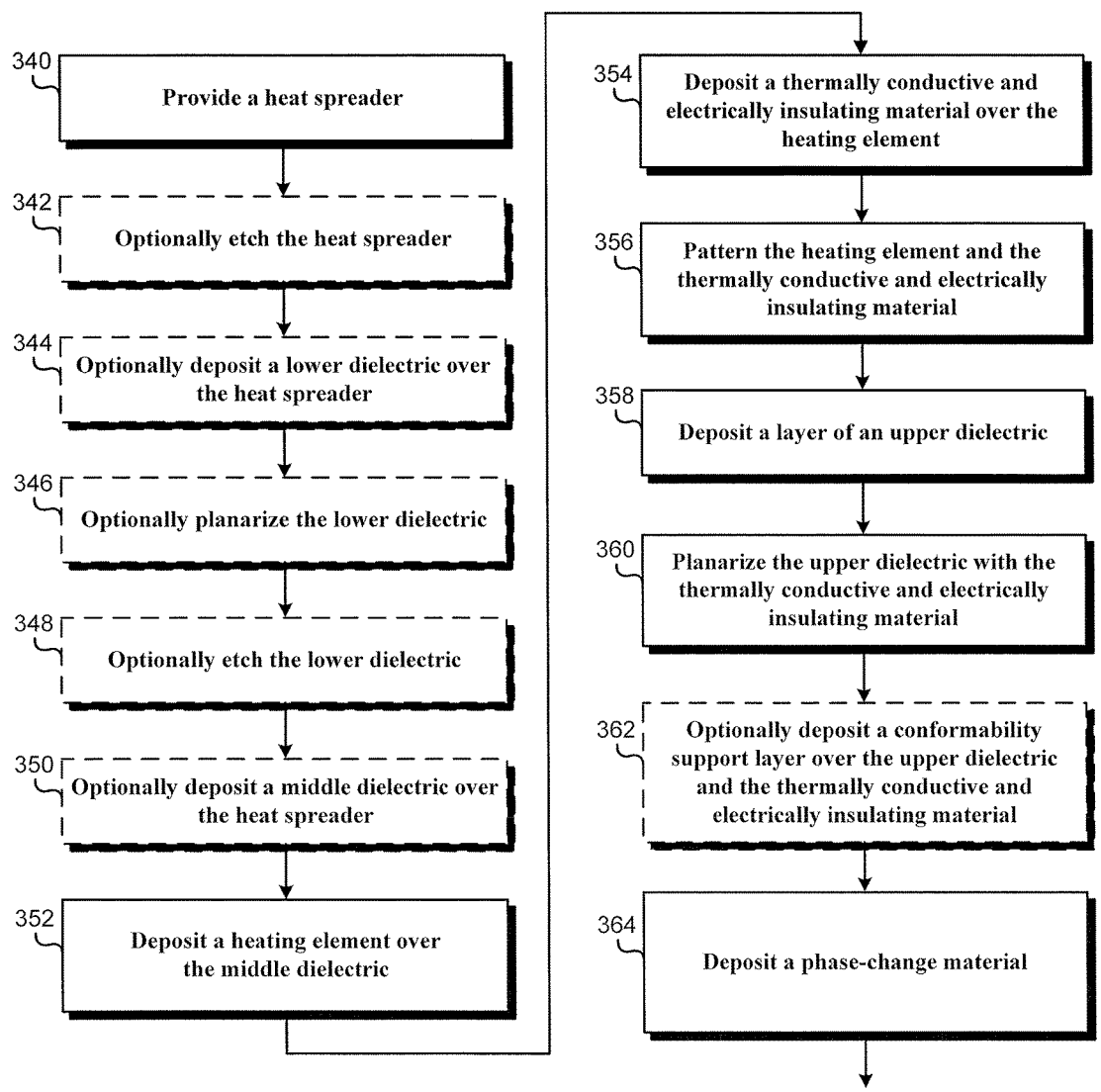
FIGS. 3A and 3B illustrate a flowchart of an exemplary method for manufacturing a PCM RF switch according to one implementation of the present application.

FIG. 3A illustrates a portion of a flowchart of an exemplary method for manufacturing a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions shown with dashed lines are considered optional. Actions 340 through 364 shown in the flowchart of FIG. 3A are sufficient to describe one implementation of the present inventive concepts, other implementations of the present inventive concepts may utilize actions different from those shown in the flowchart of FIG. 3A. Moreover, structures shown in FIGS. 4 through 16 illustrate the results of performing actions 340 through 364 in the flowchart of FIG. 3A, respectively.

Figure 4:
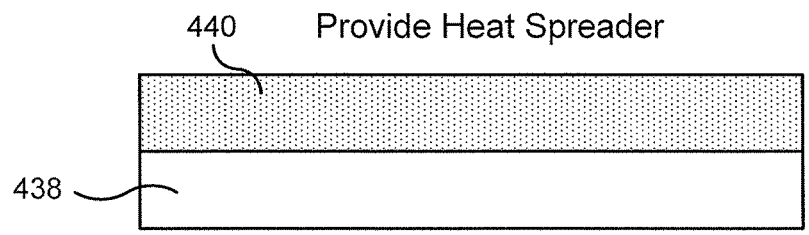
FIGS. 4 through 20 each illustrate actions according to an exemplary method for manufacturing a PCM RF switch according to one implementation of the present application.

The method begins with action 340 by providing a heat spreader. Referring to FIG. 4, heat spreader 440 is provided over substrate 438. Heat spreader 440 may be any material with high thermal conductivity. In one implementation, heat spreader 440 may be a material with both high thermal conductivity and high electrical resistivity. In various implementations, heat spreader 440 can comprise aluminum nitride (AlN), aluminum oxide ($Al_xO_Y$), beryllium oxide ($Be_xO_Y$), silicon carbide (SiC), diamond, or diamond-like carbon. Heat spreader 440 can be provided, for example, by physical vapor deposition (PVD), chemical vapor deposition (CVD), or plasma enhanced chemical vapor deposition (PECVD). In one implementation, the thickness of heat spreader 440 is approximately one micron (1 μm). In one implementation, substrate 438 is an insulator, such as silicon oxide ($SiO_2$). In various implementations, substrate 438 is a silicon (Si), silicon-on-insulator (SOI), sapphire, complementary metal-oxide-semiconductor (CMOS), bipolar CMOS (BiCMOS), or group III-V substrate. In one implementation, heat spreader 440 itself performs as a substrate and a separate substrate is not used. For example, heat spreader 440 can comprise Si and be provided without substrate 438. In one implementation, heat spreader 440 can be integrated with substrate 438.

Figure 5:
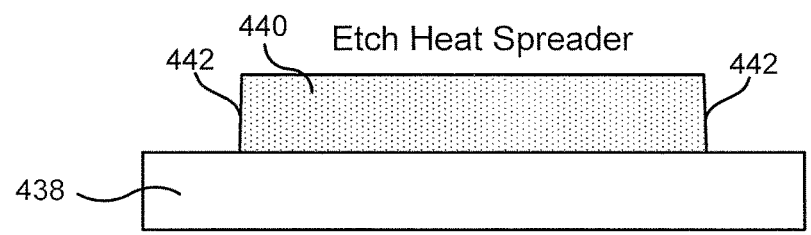

The method optionally continues with action 342 by etching the heat spreader. Referring to FIG. 5, outer segments of heat spreader 440 are etched away, leaving sides 442. In one implementation, plasma dry etching is used for anisotropic etching of heat spreader 440 on substrate 438. In one implementation, the anisotropic etching in action 342 leaves strain-relieving chamfers (not shown) at sides 442. It is noted that action 342 is an optional action since heat spreader 440 does not have to be necessarily etched, and in some implementations heat spreader 440 can remain coextensive with substrate 438.

Figure 6:
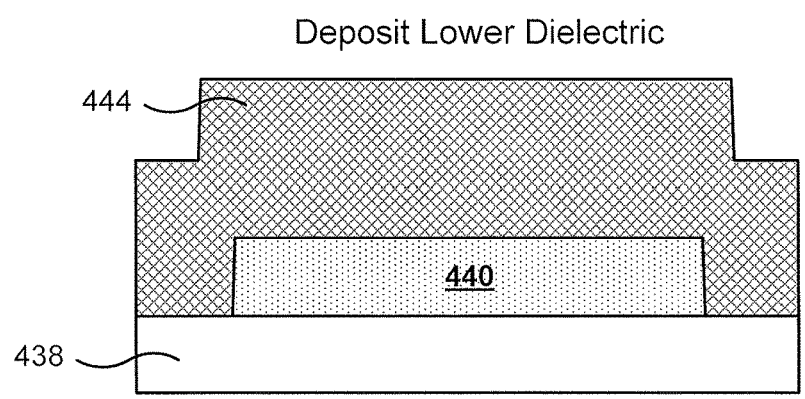

The method optionally continues with action 344 by depositing a lower dielectric over the heat spreader. Referring to FIG. 6, lower dielectric 444 is deposited over heat spreader 440 which is in turn situated over substrate 438. In one implementation, lower dielectric 444 is $SiO_2$. In other implementations, lower dielectric 444 is silicon nitride ($Si_xN_Y$), or another dielectric. Lower dielectric 444 can be deposited, for example, by PECVD or high density plasma CVD (HDP-CVD). In one implementation, the deposition thickness of lower dielectric 444 can range from approximately one and a half microns to approximately two microns (0.5 μm-2 μm). Action 344 is optional in that the inventive concepts of the present application may be implemented without depositing lower dielectric 444. For example, where action 342 of optionally etching heat spreader 440 is omitted, action 344 of depositing lower dielectric 444 can be omitted.

Figure 7:
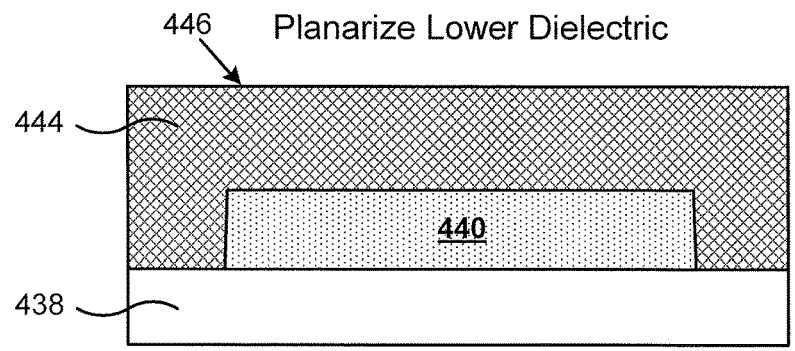

The method optionally continues with action 346 by planarizing the lower dielectric. Referring to FIG. 7, lower dielectric 444 is planarized so as to have substantially planar top surface 446. In one implementation, chemical machine polishing (CMP) is used to planarize lower dielectric 444. Substrate 438 underlies lower dielectric 444 and heat spreader 440. Action 346 is optional in that the inventive concepts of the present application may be implemented without planarizing lower dielectric 444. For example, where action 344 of depositing lower dielectric 444 is omitted, action 346 of planarizing lower dielectric 444 can be omitted.

Figure 8:
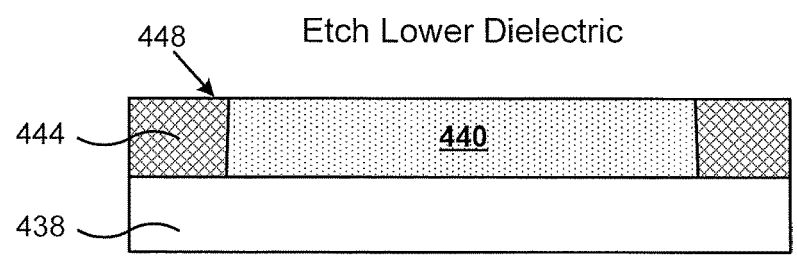

The method optionally continues with action 348 by etching the lower dielectric. Referring to FIG. 8, lower dielectric 444 is etched down so that top surface 448 of lower dielectric 444 is substantially coplanar with heat spreader 440. Thus, the thickness of lower dielectric 444 will substantially match the thickness of heat spreader 440. For example, in one implementation, both the thickness of lower dielectric 444 after etching and the thickness of heat spreader 440 are approximately one micron (1 μm). In this implementation, heat spreader 440 may perform as an etch stop while lower dielectric 444 is selectively etched. In one implementation, reactive ion etching (RIE) is used to etch lower dielectric 444. In one implementation, the RIE in action 348 leaves top surface 448 of lower dielectric 444 below heat spreader 440, and then CMP is used to touch polish heat spreader 440 so that heat spreader 440 is substantially coplanar with top surface 448 of lower dielectric 444. Substrate 438 underlies lower dielectric 444 and heat spreader 440. Action 348 is optional in that the inventive concepts of the present application may be implemented without etching lower dielectric 444. For example, where action 342 of optionally etching heat spreader 440 and action 344 of optionally depositing lower dielectric 444 are omitted, action 348 of optionally etching lower dielectric 444 is moot and can thus be omitted.

Figure 9:
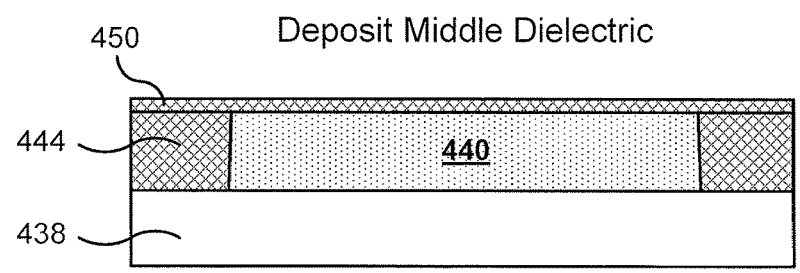

The method optionally continues with action 350 by depositing a middle dielectric over the heat spreader. Referring to FIG. 9, middle dielectric 450 can be optionally deposited over lower dielectric 444 (in case optional lower dielectric 444 is utilized) and over heat spreader 440. In one implementation, middle dielectric 450 is $SiO_2$. In other implementations, middle dielectric 450 is $Si_xN_Y$, or another dielectric. Middle dielectric 450 can be deposited, for example, by PECVD or HDP-CVD. In one implementation, the thickness of middle dielectric 450 is approximately 100 angstroms (100 Å). Substrate 438 underlies lower dielectric 444 and heat spreader 440.

Figure 10:
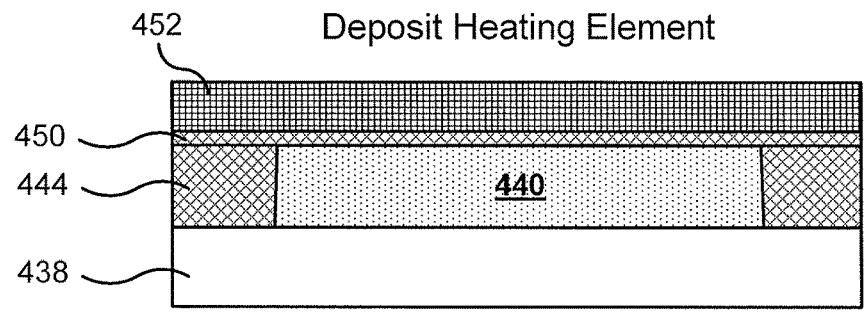

The method continues with action 352 by depositing a heating element. Referring to FIG. 10, heating element 452 is deposited over optional middle dielectric 450. It is noted that in case optional middle dielectric 450 is not used, heating element 452 can be deposited directly on heat spreader 440 (which may be a blanket unetched layer of a high thermal conductivity material). Alternatively, in one implementation, heating element 452 can be deposited over lower dielectric 444 (in case optional lower dielectric 444 is utilized) and over heat spreader 440, where middle dielectric 450 is not used.

In one implementation, heating element 452 can be deposited, for example, by PVD. Heating element 452 can comprise any material capable of Joule heating that has a melting temperature higher than that of a PCM, such as PCM 464 in FIG. 16. Preferably, heating element 452 comprises a material that exhibits little or substantially no electromigration. In various implementations, heating element 452 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heating element 452 comprises tungsten lined with titanium and titanium nitride. In one implementation, heating element 452 can have a thickness of approximately five hundred angstroms to approximately five thousand angstroms (500 Å-5000 Å). As further shown in FIG. 10, substrate 438 underlies lower dielectric 444 and heat spreader 440.

Figure 11:
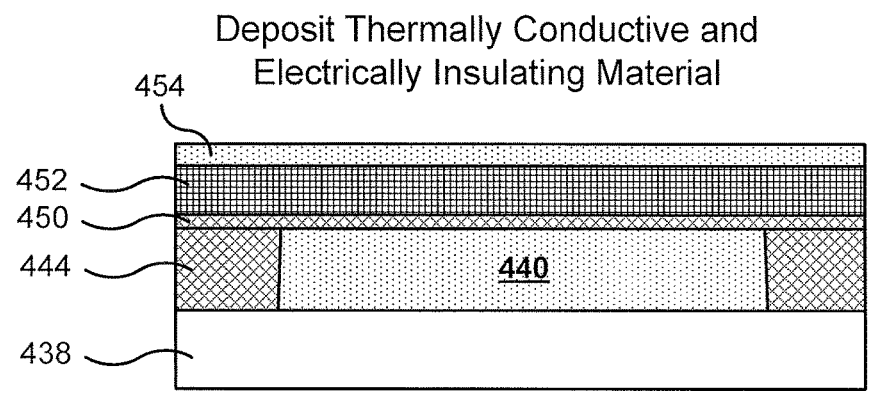

The method continues with action 354 by depositing a thermally conductive and electrically insulating material over the heating element. Referring to FIG. 11, thermally conductive and electrically insulating material 454 is deposited over heating element 452. Thermally conductive and electrically insulating material 454 may be any material with high thermal conductivity and high electrical resistivity. In various implementations, thermally conductive and electrically insulating material 454 can comprise AlN, $Al_xO_y$, $Be_xO_y$, SiC, $Si_xN_y$, diamond, or diamond-like carbon. Thermally conductive and electrically insulating material 454 can be deposited, for example, by PVD, CVD, or PECVD. In one implementation, thermally conductive and electrically insulating material 454 can have a thickness of approximately five hundred angstroms to approximately five thousand angstroms (500 Å-5000 Å). Also shown in FIG. 11 is middle dielectric 450 that underlies heating element 452 and substrate 438 that underlies lower dielectric 444 and heat spreader 440.

Figure 12:
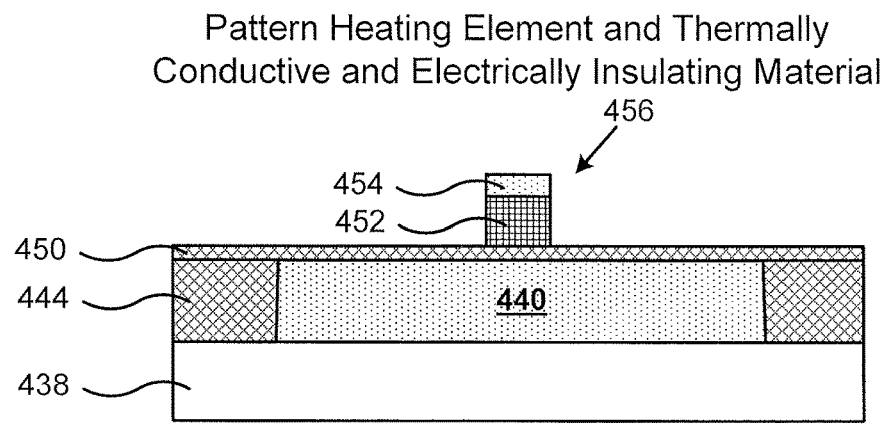

The method continues with action 356 by patterning the heating element and the thermally conductive and electrically insulating material. Referring to FIG. 12, outer segments of heating element 452 and thermally conductive and electrically insulating material 454 are patterned, forming pattern 456. In this implementation, action 356 for patterning heating element 452 and the thermally conductive and electrically insulating material 454 may comprise two different patterning actions. In the first patterning action, thermally conductive and electrically insulating material 454 can be patterned using a chlorine-based dry etch. In the second patterning action, heating element 452 can be patterned using a fluorine-based dry etch. Both patterning actions can be performed using a single mask. As a result, heating element 452 and thermally conductive and electrically insulating material 454 will be self-aligned in pattern 456. In one implementation, action 356 for by patterning heating element 452 and the thermally conductive and electrically insulating material 454 may comprise a single patterning action. In various implementation, action 356 may comprise partially or entirely patterning outer segments of middle dielectric 450. In this implementation, heat spreader 440 may perform as a stop layer while middle dielectric 450 is selectively etched. The materials for heat spreader 440, middle dielectric 450, and the etchant used to pattern middle dielectric 450 can be chosen such that the etchant used to pattern middle dielectric 450 is highly selective of middle dielectric 450 but stops at heat spreader 440. Further shown in FIG. 12 is substrate 438 that underlies lower dielectric 444 and heat spreader 440.

Figure 13:
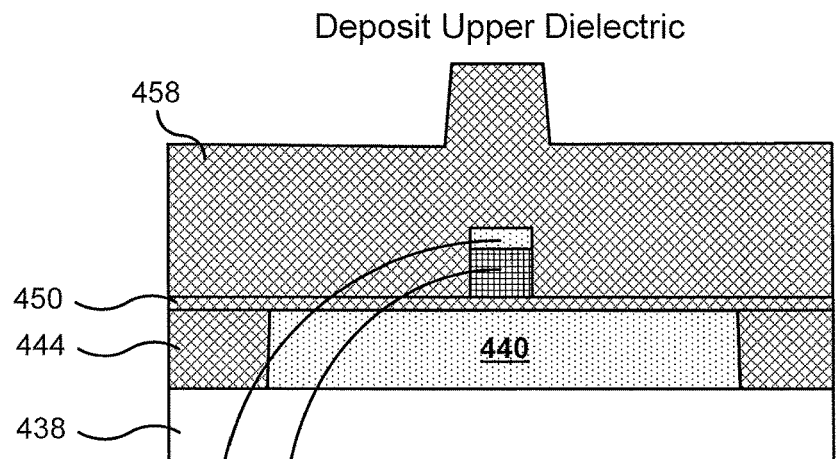

The method continues with action 358 by depositing a layer of an upper dielectric. Referring to FIG. 13, upper dielectric 458 is deposited over middle dielectric 450 and over pattern 456 (numbered in FIG. 12) of heating element 452 and thermally conductive and electrically insulating material 454. In one implementation, upper dielectric 458 is $SiO_2$. In other implementations, upper dielectric 458 is $Si_xN_y$, or another dielectric. Upper dielectric 458 can be deposited, for example, by PECVD or HDP-CVD. In one implementation, the deposition thickness of upper dielectric 458 can range from approximately one and a half microns to approximately two microns (0.5 μm-2 μm). Further shown in FIG. 13 is substrate 438 that underlies lower dielectric 444 and heat spreader 440.

Figure 14:
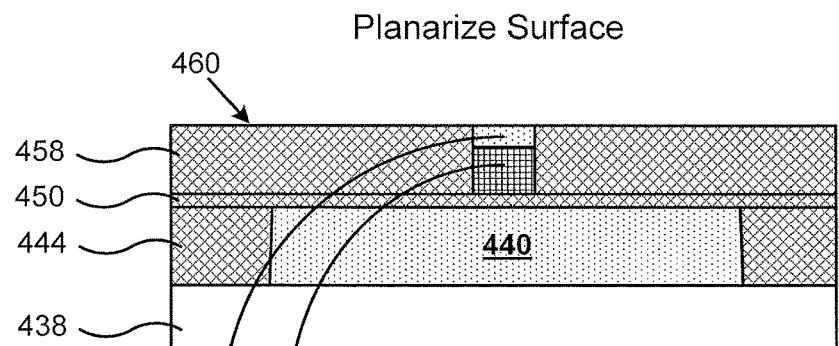

The method continues with action 360 by planarizing the upper dielectric with the thermally conductive and electrically insulating material. Referring to FIG. 14, upper dielectric 458 is substantially planarized with thermally conductive and electrically insulating material 454 to form planar surface 460. In one implementation, CMP is used to planarize upper dielectric 458 with thermally conductive and electrically insulating material 454. In one implementation, CMP is used to planarize upper dielectric 458 only, and then RIE is used to planarize upper dielectric 458 with thermally conductive and electrically insulating material 454. In one implementation, the RIE in action 360 leaves a top surface of upper dielectric 458 below thermally conductive and electrically insulating material 454, and then CMP is used to touch polish thermally conductive and electrically insulating material 454 to form planar surface 460. In one implementation, any other planarization technique may be used. Also shown in FIG. 14 is middle dielectric 450 that underlies heating element 452 and substrate 438 that underlies lower dielectric 444 and heat spreader 440.

Figure 15:
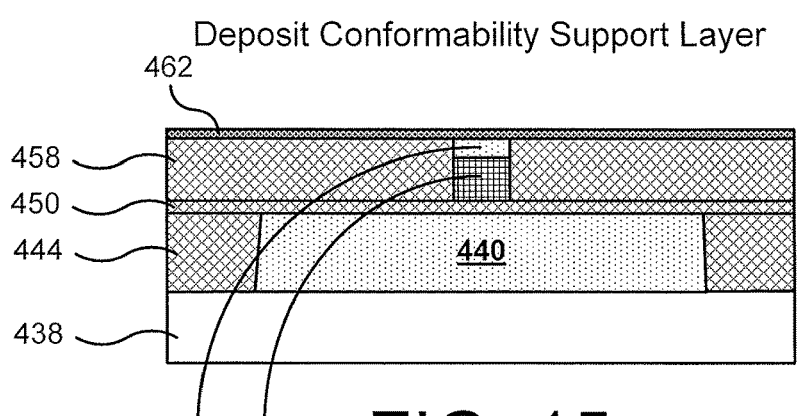

The method optionally continues with action 362 by depositing a "conformability support layer" over the upper dielectric and the thermally conductive and electrically insulating material. Referring to FIG. 15, conformability support layer 462 is deposited over upper dielectric 458 and thermally conductive and electrically insulating material 454. In one implementation, conformability support layer 462 is $Si_xN_y$. In another implementation, conformability support layer 462 is $SiO_2$. Conformability support layer 462 can be deposited, for example, by PECVD or HDP-CVD. In one implementation, conformability support layer 462 can have a thickness of approximately fifty angstroms to approximately five hundred angstroms (50 Å-500 Å). According to the present application, "conformability support layer" is a homogenous layer that allows a subsequent deposition to be substantially uniform with respect to that layer. By optionally depositing conformability support layer 462, during a subsequent PCM deposition action, PCM can be deposited on a homogenous surface, thereby allowing the PCM to be substantially uniform with respect to that surface. If conformability support layer 462 were not used, subsequently deposited PCM would be deposited on a non-homogeneous surface of thermally conductive and electrically insulating material 454 and upper dielectric 458, and nonconformities are likely to occur in the subsequently deposited PCM, particularly around interfaces of thermally conductive and electrically insulating material 454 and upper dielectric 458. Also shown in FIG. 15 is middle dielectric 450 that underlies heating element 452 and substrate 438 that underlies lower dielectric 444 and heat spreader 440. Action 362 is optional in that the inventive concepts of the present application may be implemented without depositing conformability support layer 462.

Figure 16:
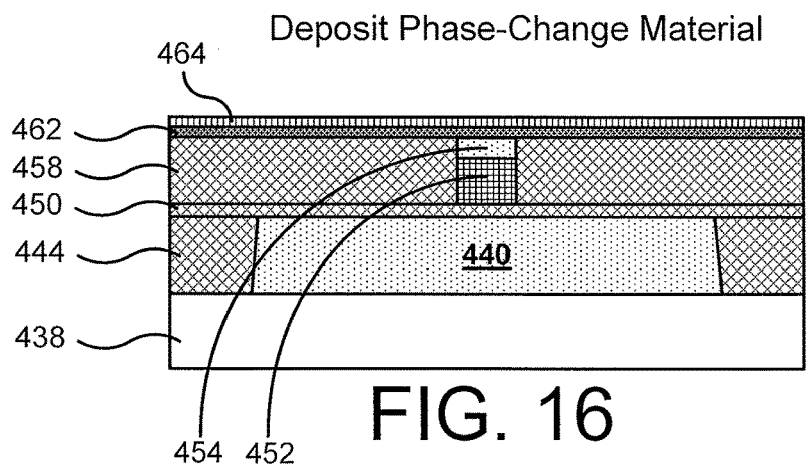

The method continues with action 364 by depositing phase-change material. Referring to FIG. 16, PCM 464 is deposited over conformability support layer 462 (in case optional layer 462 is utilized) and over upper dielectric 458 and thermally conductive and electrically insulating material 454. PCM 464 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 464 can be germanium telluride having from forty percent to sixty percent germanium by composition (i.e., $Ge_XTe_Y$, where $0.4 \leq X \leq 0.6$ and $Y=1-X$). The material for PCM 464 can be chosen based upon ON state resistivity, OFF state electric field breakdown threshold, crystallization temperature, melting temperature, or other considerations.

PCM 464 can be deposited, for example, by PVD sputtering, CVD, evaporation, or atomic layer deposition (ALD). In one implementation, PCM 464 can have a thickness of approximately five hundred angstroms to approximately two thousand angstroms (500 Å-2000 Å). In other implementations, PCM 464 can have any other thicknesses. The thickness of PCM 464 can be chosen based upon sheet resistance, crystallization power, amorphization power, or other considerations. Further shown in FIG. 16 is middle dielectric 450 that underlies heating element 452 and substrate 438 that underlies lower dielectric 444 and heat spreader 440.

Figure 3B:
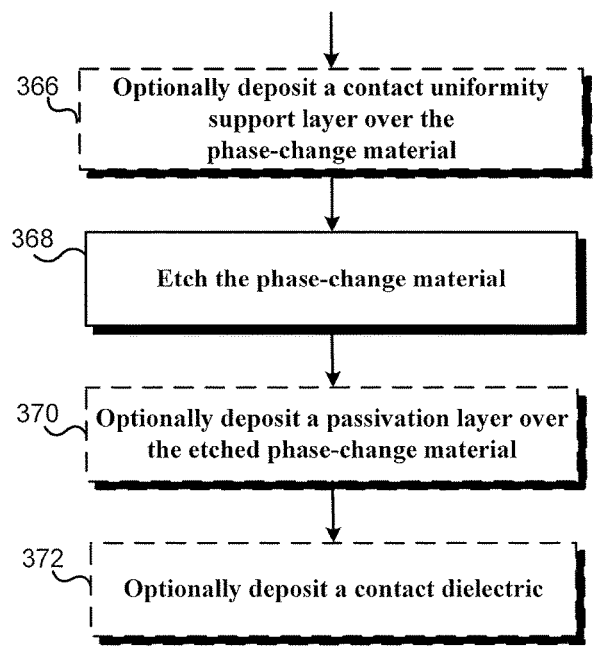

FIG. 3B is the remaining portion of the flowchart of FIG. 3A illustrating an exemplary method for manufacturing a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions shown with dashed lines are considered optional. Actions 366 through 372 shown in the flowchart of FIG. 3B are sufficient to describe one implementation of the present inventive concepts, other implementations of the present inventive concepts may utilize actions different from those shown in the flowchart of FIG. 3B. Moreover, structures shown in FIGS. 17 through 20 illustrate the results of performing actions 366 through 372 in the flowchart of FIG. 3B.

Figure 17:
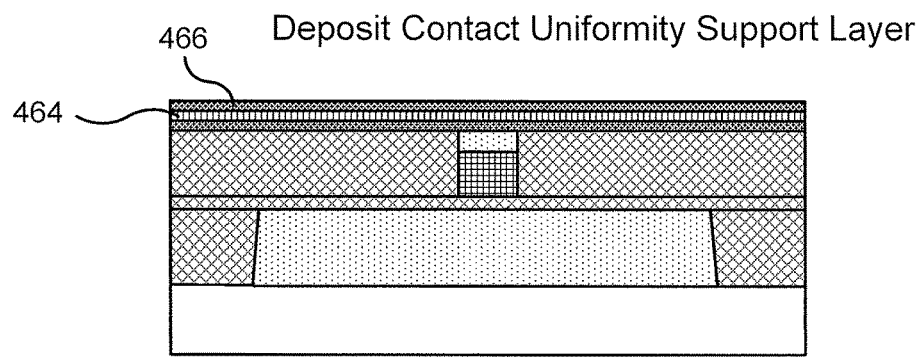

The method optionally continues with action 366 by depositing a contact uniformity support layer over the phase-change material. Referring to FIG. 17, contact uniformity support layer 466 is deposited over PCM 464. In one implementation, contact uniformity support layer 466 is $Si_XN_Y$. Contact uniformity support layer 466 can be deposited, for example, by PECVD or HDP-CVD. In one implementation, contact uniformity support layer 466 can have a thickness of approximately fifty angstroms to approximately two thousand angstroms (50 Å-2000 Å). By depositing contact uniformity support layer 466 as shown in FIG. 17, during a subsequent etching of PCM contact holes, contact uniformity support layer 466 performs as an etch stop. In this implementation, etching PCM contact holes may comprise two different etching actions. In the first etching action, a contact dielectric, such as contact dielectric 472 in FIG. 20, can be aggressively etched to form most of the PCM contact holes. This first etching action can use a selective etch, for example, a fluorine-based plasma dry etch, and contact uniformity support layer 466 can perform as an etch stop while contact dielectric 472 is selectively etched. In the second etching action, contact uniformity support layer 466 can be etched less aggressively. As a result, PCM 464 will remain substantially intact, and uniform contact can be made to PCM 464. Because the $R_{ON}$ of a PCM RF switch, such as PCM RF switch 110 in FIG. 1B, depends heavily on the uniformity of contacts made with PCM 464, the $R_{ON}$ will be significantly lower when optional contact uniformity support layer 466 is used. In one implementation, contact uniformity support layer 466 is substantially thinner than contact dielectric 472. Action 366 is optional in that the inventive concepts of the present application may be implemented without depositing contact uniformity support layer 466.

Figure 18:
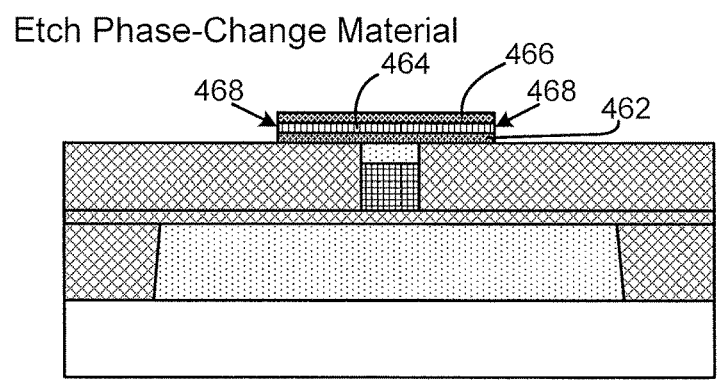

The method continues with action 368 by etching the phase-change material. Referring to FIG. 18, outer segments of PCM 464 are etched away, leaving sides 468. In the present implementation, outer segments of contact uniformity support layer 466 and conformability support layer 462 are also etched away. In one implementation, a fluorine-based plasma dry etch is used. By etching PCM 464 as shown in FIG. 18, a maximum channel length of the PCM RF switch, and a maximum separation of contacts, can be determined.

Figure 19:
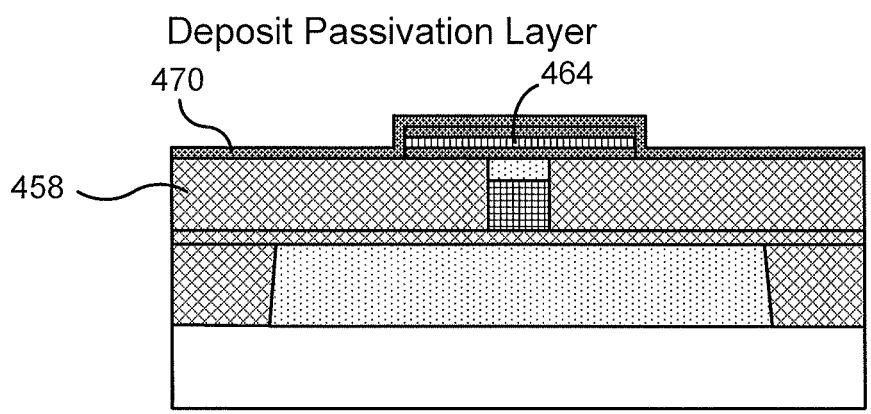

The method optionally continues with action 370 by depositing a passivation layer over the etched phase-change material. Referring to FIG. 19, passivation layer 470 is deposited over PCM 464. In the present implementation, passivation layer 470 is also deposited over upper dielectric 458. In one implementation, passivation layer 470 is $SiO_2$. In another implementation, passivation layer 470 can be $Si_XN_Y$. Passivation layer 470 can be deposited, for example, by PECVD or HDP-CVD. In one implementation, passivation layer 470 can have a thickness of approximately fifty angstroms to approximately five hundred angstroms (50 Å-500 Å). Passivation layer 470 covers sides 468 (numbered in FIG. 18) of PCM 464. Action 370 is optional in that the inventive concepts of the present application may be implemented without depositing passivation layer 470.

Figure 20:
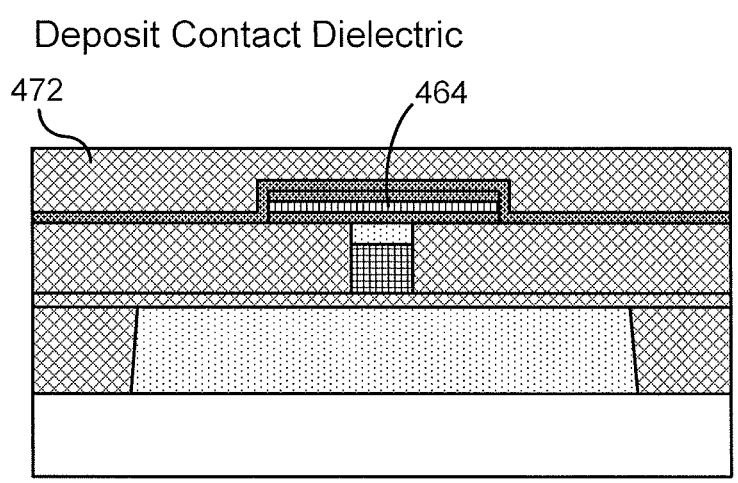

The method optionally continues with action 372 by depositing a contact dielectric over any optional passivation layer, and the underlying layers (including any optional underlying layers). Referring to FIG. 20, contact dielectric 472 is deposited over any optional passivation layer 470, and any underlying optional contact uniformity support layer 466 (numbered in FIG. 18), and PCM 464, and any optional conformability support layer 462 (numbered in FIG. 18). In one implementation, contact dielectric 472 is $SiO_2$. In other implementations, contact dielectric 472 is $Si_XN_Y$, or another dielectric. Contact dielectric 472 can be deposited, for example, by PECVD or HDP-CVD. Referring to FIG. 20, contact dielectric 472 is planarized so as to have a substantially planar top surface. In one implementation, CMP is used to planarize contact dielectric 472. Action 372 is optional in that the inventive concepts of the present application may be implemented without depositing contact dielectric 472.

By utilizing the methods disclosed in the present application, a PCM RF switch employing phase-change material 464 can be reliably manufactured. Heat spreader 440 can perform as a stop layer during patterning of heating element 452 and thermally conductive and electrically insulating material 454, and can remain in the final PCM RF switch to dissipate heat and quench PCM 464 after each heat pulse. Heating element 452 is deposited using, for example, CMOS-compatible tungsten, and can receive crystallizing pulse 102 and amorphizing pulse 202. Heating element 452 is deposited with uniform thickness across wafers, resulting in uniform resistance in separate devices. Because thicker thermally conductive and electrically insulating material 454 advantageously reduces $C_{OFF}$ between PCM contacts, such as input electrode 114 or output electrode 116 in FIG. 1B, and heating element 452, while thinner thermally conductive and electrically insulating material 454 improves heat transfer between heating element 452 and PCM 464, the present methods enable control over a critical design dimension. Further, because thermally conductive and electrically insulating material 454 is deposited directly over and patterned with heating element 452, thermally conductive and electrically insulating material 454 is self-aligned with heating element 452, allowing effective and efficient heat transfer to PCM 464. A PCM RF switch can therefore transition between OFF and ON states using lower power and/or quicker pulses.

Depositing middle dielectric 450 biases vertical heat dissipation from heating element 452 toward the active segment of PCM 464, rather than toward heat spreader 440, enabling a PCM RF switch to transition between OFF and ON states using even lower power and/or even quicker pulses. Depositing conformability support layer 462 reduces nonconformities in PCM 464, thus improving reliability. Depositing contact uniformity support layer 466 advantageously reduces $R_{ON}$.

Thus, various implementations of the present application achieve a method of manufacturing a PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of manufacturing a radio frequency (RF) switch, the method comprising:
   providing a heat spreader;
   depositing a heating element;
   depositing a thermally conductive and electrically insulating material over said heating element;
   patterning said heating element and said thermally conductive and electrically insulating material;
   depositing a layer of an upper dielectric;
   substantially planarizing said upper dielectric with said thermally conductive and electrically insulating material;
   depositing a conformability support layer over said upper dielectric and said thermally conductive and electrically insulating material;
   depositing a phase-change material over said conformability support layer.

2. The method of claim 1, further comprising depositing a middle dielectric over said heat spreader prior to depositing said heating element, and wherein said heating element is deposited over said middle dielectric.

3. The method of claim 1, wherein said conformability support layer comprises a material selected from the group consisting of silicon nitride ($Si_xN_y$) and silicon oxide ($SiO_2$).

4. The method of claim 1, wherein said thermally conductive and electrically insulating material is self-aligned with said heating element.

5. The method of claim 1, wherein said phase-change material comprises a material selected from the group consisting of germanium telluride ($Ge_xTe_y$), germanium antimony telluride ($Ge_xSb_yTe_z$), germanium selenide ($Ge_xSe_y$), and any other chalcogenide.

6. The method of claim 1, wherein said heat spreader comprises a material selected from the group consisting of silicon (Si), aluminum nitride (AlN), aluminum oxide ($Al_xO_y$), beryllium oxide ($Be_xO_y$), silicon carbide (SiC), diamond, and diamond-like carbon.

7. The method of claim 1, wherein said heat spreader performs as a stop layer during said patterning said heating element and said thermally conductive and electrically insulating material.

8. The method of claim 1, further comprising depositing a contact uniformity support layer over said phase-change material.

9. The method of claim 1, further comprising:
   etching said phase-change material;
   depositing a passivation layer over said etched phase-change material.

10. A method of manufacturing a radio frequency (RF) switch, the method comprising:
    providing a heat spreader;
    depositing a middle dielectric over said heat spreader;
    depositing a heating element over said middle dielectric;
    depositing a thermally conductive and electrically insulating material over said heating element;
    patterning said heating element and said thermally conductive and electrically insulating material;
    depositing a layer of an upper dielectric;
    depositing a phase-change material over said upper dielectric and said thermally conductive and electrically insulating material.

11. The method of claim 10, further comprising substantially planarizing said upper dielectric with said thermally conductive and electrically insulating material prior to said depositing said phase-change material.

12. The method of claim 10, wherein said phase-change material comprises a material selected from the group consisting of germanium telluride ($Ge_xTe_y$), germanium antimony telluride ($Ge_xSb_yTe_z$), germanium selenide ($Ge_xSe_y$), and any other chalcogenide.

13. The method of claim 10, wherein said heat spreader comprises a material selected from the group consisting of silicon (Si), aluminum nitride (AlN), aluminum oxide ($Al_xO_y$), beryllium oxide ($Be_xO_y$), silicon carbide (SiC), diamond, and diamond-like carbon.

14. The method of claim 10, wherein said heat spreader performs as a stop layer during said patterning said heating element and said thermally conductive and electrically insulating material.

15. The method of claim 10, wherein said thermally conductive and electrically insulating material comprises a material selected from the group consisting of aluminum nitride (AlN), aluminum oxide ($Al_xO_y$), beryllium oxide ($Be_xO_y$), silicon carbide (SiC), silicon nitride ($Si_xN_y$), diamond, and diamond-like carbon.

16. The method of claim 10, further comprising depositing a contact uniformity support layer over said phase-change material.

17. A method of manufacturing a radio frequency (RF) switch, the method comprising:
    providing a heat spreader;

depositing a heating element;
depositing a thermally conductive and electrically insulating material over said heating element;
patterning said heating element and said thermally conductive and electrically insulating material, wherein said thermally conductive and electrically insulating material is self-aligned with said heating element;
depositing a layer of an upper dielectric;
depositing a phase-change material over said upper dielectric and said thermally conductive and electrically insulating material.

18. The method of claim 17, wherein said phase-change material comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

19. The method of claim 17, wherein said heat spreader comprises a material selected from the group consisting of silicon (Si), aluminum nitride (AlN), aluminum oxide ($Al_XO_Y$), beryllium oxide ($Be_XO_Y$), silicon carbide (SiC), diamond, and diamond-like carbon.

20. The method of claim 17, further comprising depositing a contact uniformity support layer over said phase-change material.

* * * * *